US006811933B2

(12) United States Patent
Levenson

(10) Patent No.: US 6,811,933 B2
(45) Date of Patent: Nov. 2, 2004

(54) VORTEX PHASE SHIFT MASK FOR OPTICAL LITHOGRAPHY

(76) Inventor: Marc David Levenson, 19868 Bonnie Ridge Way, Saratoga, CA (US) 95070

( * ) Notice: Subject to any disclaimer, the term of this patent is extended or adjusted under 35 U.S.C. 154(b) by 20 days.

(21) Appl. No.: 10/186,587

(22) Filed: Jul. 1, 2002

(65) Prior Publication Data

US 2004/0002010 A1 Jan. 1, 2004

(51) Int. Cl.[7] .............................. G03F 9/00; G03C 5/00
(52) U.S. Cl. ........................................... 430/5; 430/394
(58) Field of Search ........................... 430/6, 322, 394; 716/19, 20

(56) References Cited

U.S. PATENT DOCUMENTS

| 5,914,202 A | * | 6/1999 | Nguyen et al. ................ 430/5 |
| 6,246,477 B1 | | 6/2001 | Feldman .................... 356/375 |
| 6,344,298 B1 | * | 2/2002 | Starodubov et al. ........... 430/5 |
| 6,139,994 A1 | | 10/2003 | Broeke et al. ................. 430/5 |

OTHER PUBLICATIONS

Derwent Abstract Accession No. 2002–545814158 Class U11 TW 463 232 A (United Electronics Corp) Nov. 11, 2001.
M. Feldman, Phase shift microscopes, J. Vac. Sci. Technol. B 16(6) 3647–3650. (1998).

* cited by examiner

*Primary Examiner*—S. Rosasco
(74) *Attorney, Agent, or Firm*—Rodney T. Hodgson

(57) ABSTRACT

A photolithography method and apparatus for producing minima of light intensity corresponding to a point in a phase shift mask is described. The phase shift in the light produced by the mask varies in a spiral fashion around the point so that the phase shift measured along lines drawn across the surface of the mask which pass through the point have a 180° jump at the point, and lines passing around the point have no jumps between 130° and 230°, and most preferably no jumps between 100° and 260°.

9 Claims, 5 Drawing Sheets

VORTEX PHASE SHIFT MASK FOR OPTICAL LITHOGRAPHY

FIELD OF THE INVENTION

The field of the invention is the field of lithographic masks for extremely high resolution imaging of mask features on to various substrates. In particular, the field of the invention is the field of phase shift masks, where the mask pattern is at least in part determined by the change in phase of light interacting with the surface of the mask.

BACKGROUND OF THE INVENTION

Photolithography

This invention relates to the field of microlithography for the manufacture of integrated circuits, magnetic devices, and other microdevices such as micromachines. In this field the final product is manufactured in sequential manner in which various patterns are first produced in a "resist" material with each pattern subsequently defining a product attribute. The "resist" materials, generally polymer compositions, are sensitive to light or other forms of radiation. The patterns are formed in the resist by exposing different regions of the resist material to different radiation doses. In the bright (high dose) regions, chemical changes take place in the resist that cause it to dissolve in a chemical bath or be etched away by a gas or plasma more easily (for positive resists) or less easily (negative resists) than in dim (low dose) regions. If the radiation flux on to the resist is too little, the resist is said to be underexposed, and in general the underexposed area of the positive resist will not all dissolve away, and the negative resist will only partially dissolve away when the resist is "developed", (IE dissolved or etched). With sufficient radiation flux for exposure, the unexposed and exposed areas of the resist will be developed with one area all dissolved away and the other area remaining as a protective coat for the next step in the wafer processing. For a radiation flux that is too great, the resist is overexposed and the areas exposed tend to "bloom" out and etched out lines, for example, are wider than they would be with just a sufficient exposure. For a good resist, a "manufacturing window" exists between such underexposure and overexposure fluxes.

Patterned Resist and Process

The bright and dim regions are formed using an exposure tool which generally transfers corresponding features to the resist from a mask or reticle. The masks or reticles are formed from mask substrates, which are plates of quartz or other material transparent to the radiation used for exposing the resist, coated with an opaque material such as chrome. The chrome is etched away in a pattern to form the mask. The radiation employed may be (but is not limited to) ultraviolet light and x-rays, and the regions of the mask that are opaque and transparent form a pattern of bright and dark when illuminated uniformly. In the most common implementation of this technology, a projection lens forms an image of the mask pattern in the resist film on a planar substrate. That image comprises the high and low dose regions that produce the resist pattern. When some form of light is employed in this process, it is called photolithography.

Wavefront Engineering

The patterns formed in the resist are not identical to those on the mask, and the methods of obtaining the pattern desired for the ultimate manufactured device in spite of deficiencies in the microlithography process is called "wavefront engineering." Among the various devices used for this purpose are phase shifting masks (PSM)s—which create desired dark regions through interference. Phase shift masks were first published by the inventor of the present invention in a paper entitled "Improving resolution in photolithography with a phase shifting mask," M. D. Levenson, N. S. Viswanathan, and R. A. Simpson, IEEE Trans. Electron Devices ED-29, 1828–1836 (1982). Since that time, there have been hundreds of patents and thousands of papers issued containing the phrase "phase shift mask". Phase shift masks allow production of features with smaller linewidths than conventional photolithography, in that the low dose portions of the photoresist are much narrower than the high dose portions. The pitch, however, of such narrow linewidth features is limited to $\lambda/2$ NA., where $\lambda$ is the wavelength of the light used to expose the resist and N.A. is the numerical aperture of the optical system used to expose the resist.

There are presently two types of PSMs in use: weak-PSMs such as the Attenuated-PSM and strong-PSMs such as the Alternating-Aperture-PSM. These two differ in that the weak-PSMs have only one type of bright feature, while the strong-PSMs contain two types of bright features identical except for the optical phase, which differs by ~180°. See, for example, M. Shibuya, Japanese Patent Showa 62-50811, M. D. Levenson et. al. IEEE Trans. Elect. Dev. ED-29, 1828–1836 (1982), and M. D. Levenson, Microlithograpy World 6–12 (March/April 1992).

Typically, narrow and "dark" lines may be produced by phase shift methods, where the phase shift arises from two neighboring areas of the mask which shift the phase of light interacting with the mask by 180°. The two areas of the mask are separated by a border which is a straight line on the mask, and when the mask is imaged on a resist, a very narrow line with little or no illumination between two bright areas results. Such narrow lines are valuable, for example, as gate lines in a semiconductor device. However, the length of the lines is much larger than the width of the line.

There is a demand for features which are holes in the resist with as small an area or as small a diameter as possible. Such holes are used, for example, to produce contacts to underlying conducting lines or other parts of semiconductor devices. FIG. 1 shows a sketch of the intensity of the light produced by three prior art methods for producing such holes. A T-mask is just a hole in the chrome covering of a normal mask substrate which produces the intensity given by curve 10. The minimum diameter of the light pattern is determined by diffraction, and does not get smaller as the hole in the chrome is reduced beyond a certain point. The Attenuating PSM (curve 14) and Rimshift PSM (curve 12) technologies result in somewhat smaller diameter bright areas.

U.S. Pat. No. 5,807,649 teaches a double exposure system for exposing a photoresist using a phase shift mask and with a second mask to expose unwanted dark areas left by the phase shift mask. U.S. Pat. No. 5,620,816 teaches a double exposure system where a chromeless phase-edge shift mask is used to expose all of the photoresist except on lines running in rows and/or columns, and then a customized mask is used to expose unwanted portions of the lines and/or columns. If the same or another chromeless phase-edge mask is used to expose the same resist wherein dark lines run perpendicular to those dark lines left by the first exposure, some of the unexposed areas of the resist left by the first exposure would be exposed, and an array of unexposed spots with very small diameter will result. The prior art does not show any method of producing very small regions of unexposed photoresist using a single exposure.

PSM Design

Various Electronic Design Automation (EDA) tools are known for preparing the patterns used in conventional and phase-shifting masks. In addition, OPC tools alter those patterns to account for the realities of the exposure systems. It is also known that the pattern of apertures on the phase-shifting mask need not correspond closely to the ultimate circuit pattern, at least not when a conventional block-out mask is employed for a second exposure on the resist film in concert with a first exposure made using an alternating-aperture PSM. Such second exposures erase anomalies due to phase-conflicts. Numerical Technologies, Inc., in U.S. Pat. No. 5,858,580, in particular, has demonstrated the In-Phase design system which employs a block-out mask similar in geometry to the ultimate circuit feature along with an alternating-aperture PSM composed of pairs of small apertures (shifters), one of which has 0° phase, while the other has 180°—which define the narrowest dark features between them.

Related U.S. patents issued to the inventor of the present invention are U.S. Pat. Nos. 6,287,732 and 6,251,549 issued Sep. 11, 2001 and Jun. 26, 2001 respectively. Related U.S. patent applications by the inventor of the present invention are applications entitled "Generic phase shift mask" filed Sep. 6, 2001 as U.S. patent application Ser. No. 09/947,336 now U.S. Pat. No. 6,479,196 and "Photolithography method and apparatus" filed Feb. 25, 2002 as U.S. patent application Ser. No. 10/083049. The above identified references, U.S. patents and U.S. patent applications are hereby incorporated by reference.

OBJECTS OF THE INVENTION

It is an object of the invention to provide apparatus, methods, and systems for the production of very small area features on a device.

It is an object of the invention to provide a phase shift mask substrate having features which provide for production of very small area features on a device.

It is an object of the invention to provide a phase shift mask substrate having features which provide for production of very small area features on a device.

It is an object of the invention to provide a phase shift mask having features which provide for production of very small area features on a device.

It is an object of the invention to provide a method of making a phase shift mask substrate having features which provide for production of very small area features on a device.

It is an object of the invention to provide a method of using a generic phase shift mask substrate having features which provide for production of very small area features on a device.

It is an object of the invention to provide a method of using a generic phase shift mask substrate having features which provide for production of very small area features on a device.

It is an object of the invention to provide a method for making photolithographic exposures of two dimensional arrays of small area features having pitch $<\lambda/NA$, where $\lambda$ is the wavelength of light used by the photolithographic exposure system and NA is the numerical aperture of the photolithographic system.

SUMMARY OF THE INVENTION

The present invention is a system, apparatus and method to produce very small areas features on a device. A phase shift mask substrate is produced where an area on the mask substrate has a phase shift variation around a point, such that light interacting with the area around the point has the phase of the light shifted so that there is a sharp and deep minimum of the light intensity in a first area corresponding to the point, and an annular second area surrounding the first area where the light intensity is much greater than the minimum through the entire annular area. The phase shift varies in a spiral pattern about the point so that the phase shifts suddenly by approximately 180° when measured along lines crossing the point, and the phase shifts slowly or suddenly by an amount less than 130° or greater than 230° when measured along any other line traversing an area on the mask corresponding to the second annular area. In particular, the most preferred embodiment has a substrate with a one turn spiral staircase like a set of "steps" etched down from the surface into the substrate, with the height of each step producing a phase shift from step to step of less than or much less than 130°, and the phase shift from the bottom step back up to the first step of greater than approximately 230°.

DETAILED DESCRIPTION OF THE INVENTION

Figure 2:
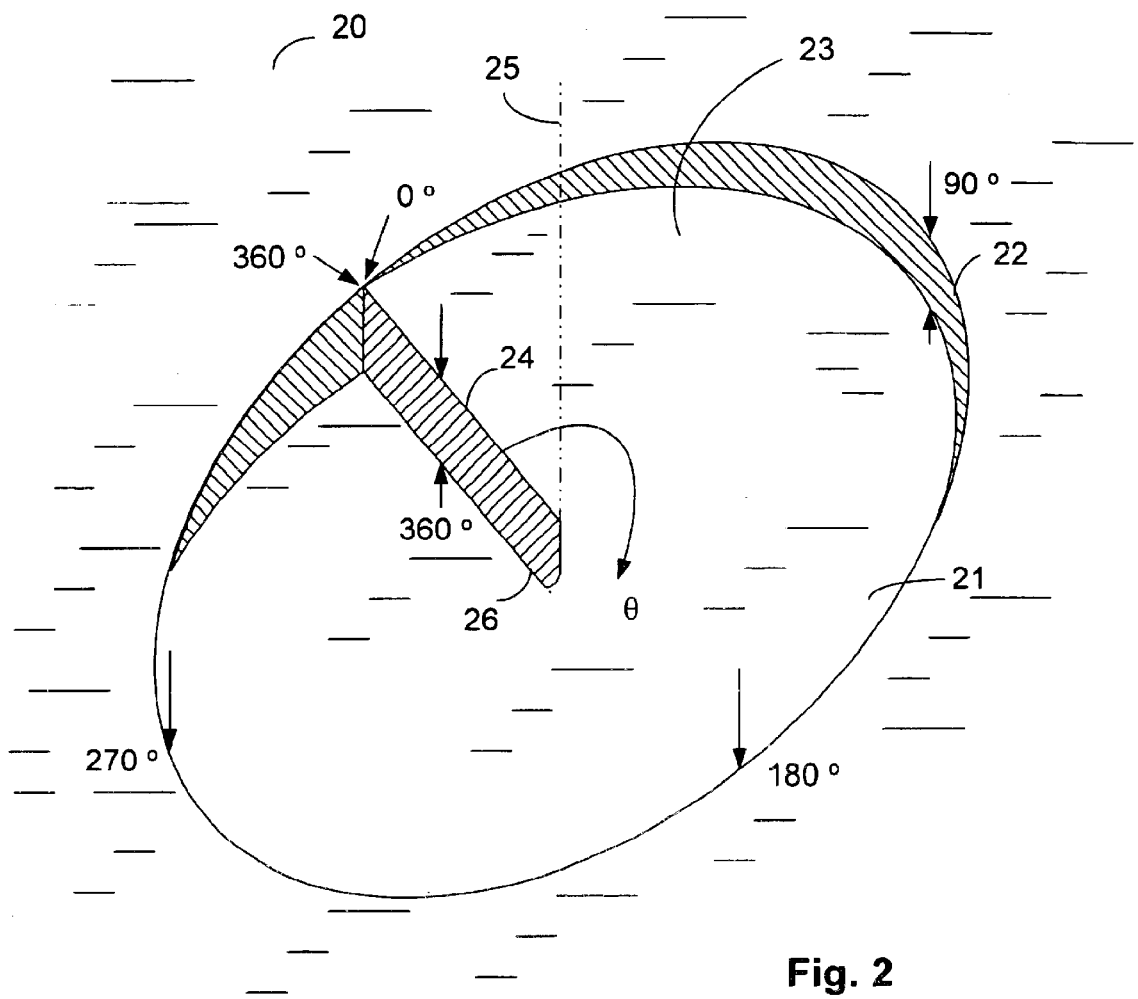
FIG. 2 shows a perspective sketch of a preferred embodiment.

FIG. 2 shows a perspective sketch of a preferred embodiment of the invention. A flat surface 20 of a phase shift mask substrate has a feature 21 etched into it. The circular edge 22 of the feature 21 is shown cutting into the surface 20. The sketch shows a spiral ramp 23 circulating about a center line 24. The ramp starts at the original surface 20 of the phase shift mask substrate at a line 24 where the phase shift is 0° with respect to the phase shift produced at the original surface 20, and proceeds clockwise around the center line 25. The ramp imparts a phase shift on light impinging upon the phase shift mask according to the depth of the cut. Phase shifts of 90°, 180° 270° and 260° with respect to the original surface 20 are shown at the positions marked on the figure. The phase shifts produce a pattern of light corresponding to the feature 21 where the light has a deep minimum of intensity at the point corresponding to the point of intersection of the center line 25 with the surface of the phase shift mask substrate 20. There is no sharp change in the phase shift from one area of the spiral ramp to another, so no dark line is produced in the field surrounding the point of intersection, and the sharp change of phase between the bottom 26 of the spiral ramp 23 and the top of the spiral ramp 24 is 360°, which also produces no dark line feature. The edge 22 produces a dark line in the illumination pattern when the phase shift between the original surface 20 and the ramp 23 is near 180°. The resulting unexposed photoresist may be exposed in a later step.

The feature of FIG. 2 produces an isolated area of minimum intensity surrounded by an annular area where the intensity is much greater throughout the annular area than the exposure at the minimum of the exposure.

Figure 3:
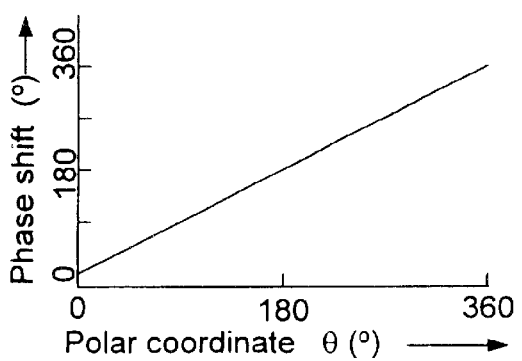
FIG. 3 shows the phase shift of FIG. 2 as a function at the polar angle $\theta$.

FIG. 3 shows the phase shift produced by the feature of FIG. 2 as a function of the polar angle θ measured around the center line 25. In preferred embodiments, the spiral shown in FIG. 2 will have a phase change from one end of line 27 which nearly encircles center line 25 to the other of nearly 720°, so that the intensity change when passing across line 26 is still very small. In general, the spiral shown in FIG. 2 will have a phase change from one end of line 27 to the other of nearly m times 360°, (where m is an integer) so that the intensity change when passing across line 26 is still very small.

A spiral pattern such as shown and described in FIG. 2 and FIG. 3 is pressed into a phase shift mask substrate by methods similar to those used to reproduce CD recordings, or other methods as known in the art of producing surface features.

Figure 4:
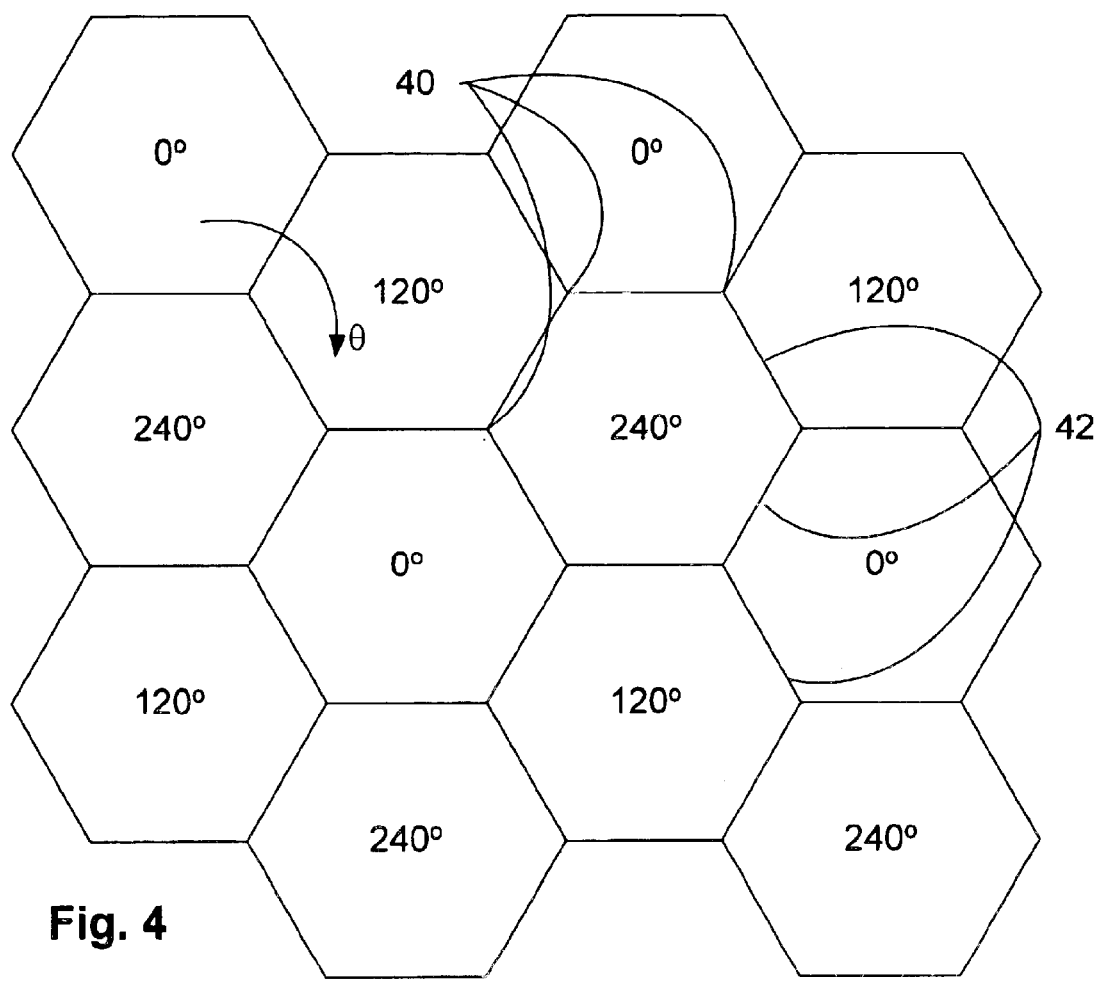
FIG. 4 shows a plan view of a phase shift mask substrate.

FIG. 4 shows a plan view of a phase shift mask substrate where the surface is formed into a number of flat parallel areas in the form of hexagons. In FIG. 4, there are three levels which cause phase shifts of 0°, 120°, and 240°. Each intersection 40 of three of the borders of the hexagon areas will produce a deep minimum in the radiation pattern of light interacting with the surface. Instead of the spiral ramp of FIG. 2, a spiral staircase having 3 treads is formed about each point. Note that adjacent points share two treads in common, and that the sense of the spiral (descending clockwise or counterclockwise) is opposite for two adjacent points. The phase boundaries 42 between two adjacent phase shift areas noted in FIG. 4 produce dark lines in the pattern having a theoretical intensity of about 25% of the full intensity for fully coherent light, while the theoretical intensity corresponding to the point 40 is zero. In practice, the minimum intensity is about 2% because of scattering in the optical system. Thus, the resist must be overexposed to ensure that the dark lines corresponding to the boundaries 42 between the phase shift areas are sufficiently exposed with respect to the areas corresponding to the points 40 so that the dark lines do not print and the dark points do print.

Specifications for resolving power and focusing of a spot or line of light in optical systems often are given in terms of full width at half maximum intensity. In the present case, the intensity is a minimum $I_{min}$ at a point, and a maximum intensity $I_{max}$ occurs in an annular region surrounding the point. The intensity varies throughout the annular region. For example, along a circular line drawn in the annular region which has the point in the center, the intensity drops to an intensity $I'_{min}$ at points on the circular line corresponding to a phase change on the mask. A specification for the "full width" of the intensity minimum may still be drawn with reference to either the maximum intensity or the intensity of the minimum measured along the defined line. In the sense of the present specification, the full width of the intensity minimum is defined as the full width of the intensity minimum measured at half the minimum intensity measured along the line ($I'_{min}/2$). The full width of the intensity minimum of the present invention is preferably less than λ/2 N.A.

Figure 5:
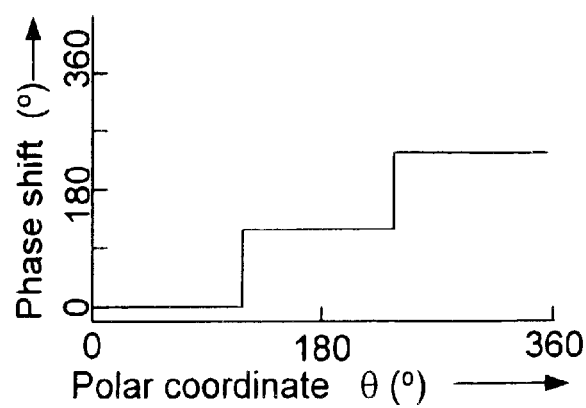
FIG. 5 shows the phase shift produced about a point as a function of the polar angle $\theta$.

FIG. 5 shows the phase shift produced about a point 40 as a function of the polar angle θ measured around the point 40. The phase shift when measured along a line nearly encircling the point 40 will appear similar to FIG. 5 when plotted against distance along the line. The spiral shown in FIG. 2 will have a phase change from one end of line 27 to the other of nearly 720°, so that the intensity change when passing across line 26 is still very small.

FIG. 6A shows the most preferred embodiment of the invention, where the phase shift mask substrate is formed into a number of flat parallel areas in the form of squares. In FIG. 6A, there are four levels which cause phase shifts of 0°, 90°, 180° and 270°. The intersections where four corners of the squares meet will cause phase shifts which cancel the intensity projected on to photoresist, and result in a deep minimum in the intensity at points corresponding to the corners of the squares. The phase shift at boundaries 62 is only 90°, in contrast to the 120° phase shift produced at the boundaries 42 of FIG. 4, so the intensity in the lines corresponding to the boundaries 62 is much greater than the 25% intensity for the lines of FIG. 4. FIG. 6A also shows optional opaque areas 60 covering the corners of the squares shown in FIG. 6A. The opaque areas reduce the intensity of the light in areas of the resist corresponding to the corners of the squares of the mask substrate of FIG. 6A. Note that adjacent opaque areas 60 have two steps of the spiral staircases in common, and that the sense of the spiral is again opposite for each pair of adjacent areas 60.

FIG. 6B shows a perspective view of four steps of the spiral staircase around an area 60.

Figure 7:
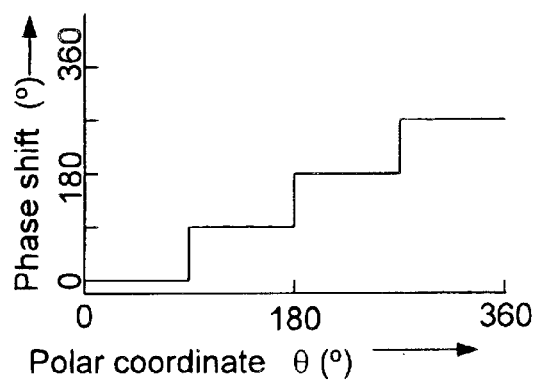
FIG. 7 shows the phase shift produced about an opaque area 60.

FIG. 7 shows the phase shift produced about an opaque area 60 as a function of the polar angle θ measured around the center of the opaque area 60.

Figure 1:
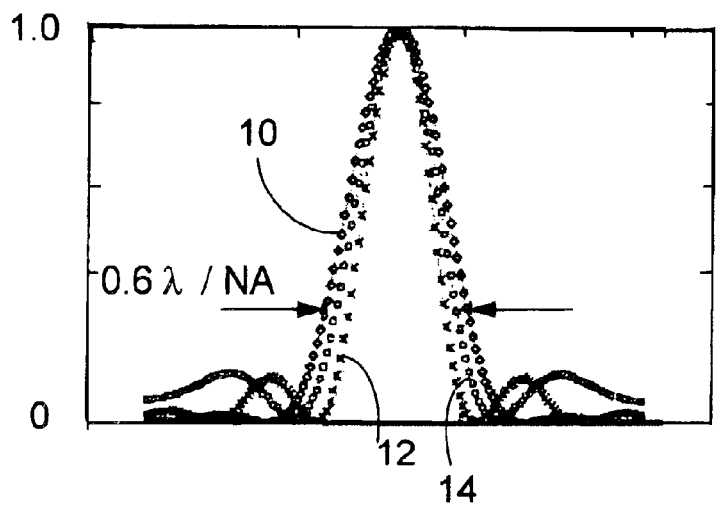
FIG. 1 shows intensity of light produced by prior art photolithography masks.
Figure 8:
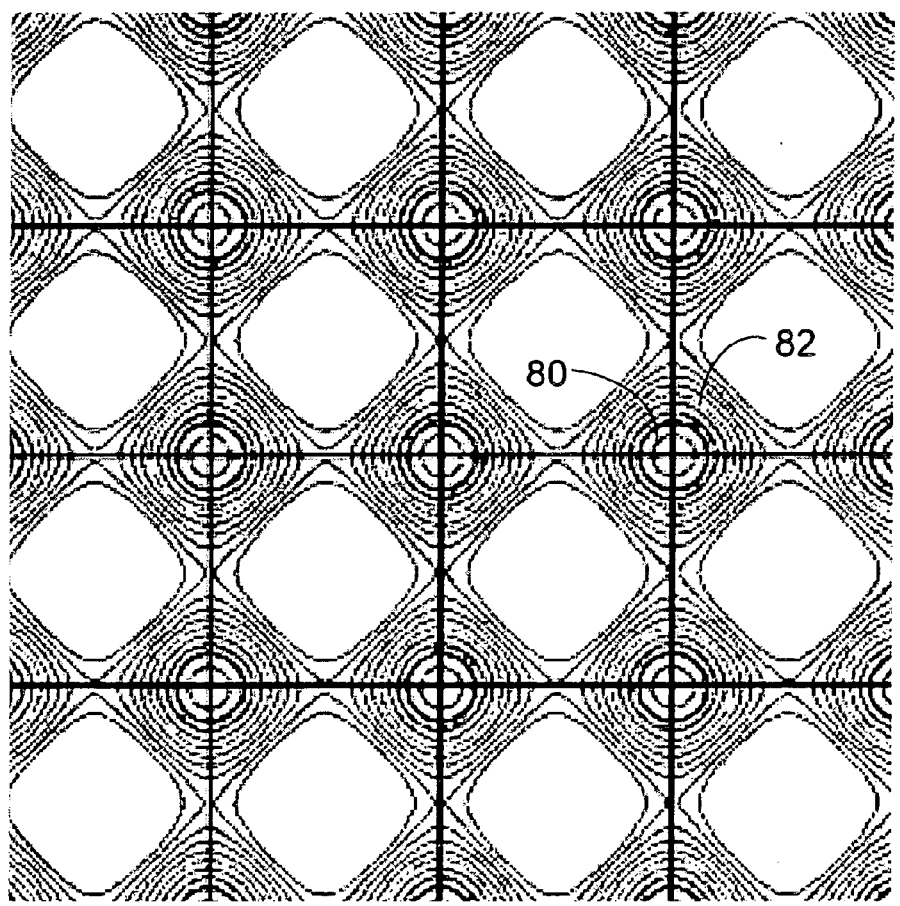
FIG. 8 shows the results of a calculation of the intensity profiles.
Figure 6:
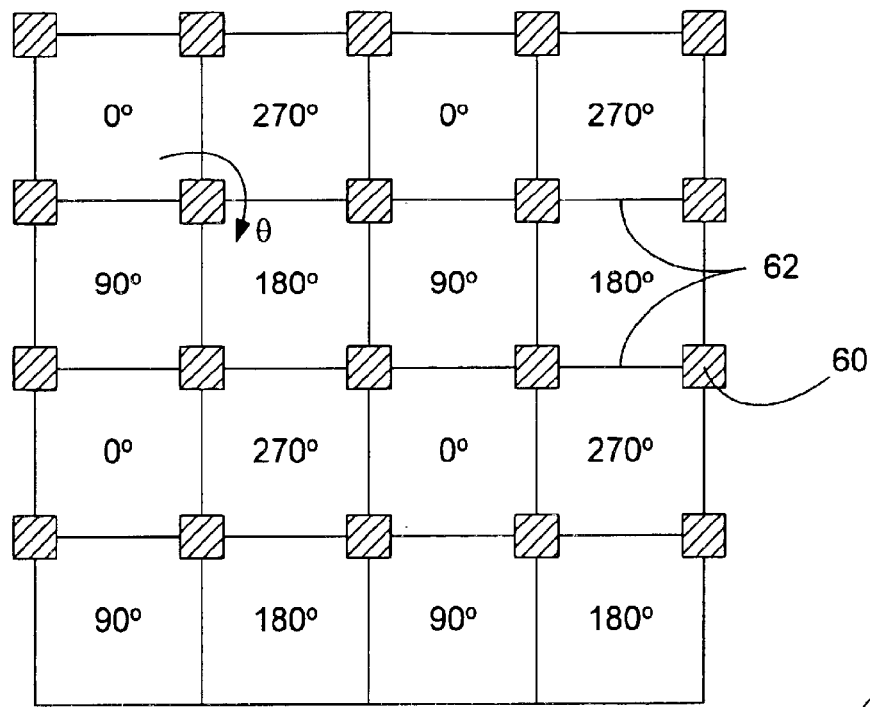
FIG. 6A shows the most preferred embodiment of the invention.
FIG. 6B shows a perspective view of four steps of the spiral staircase around an area 60.
Figure 6:
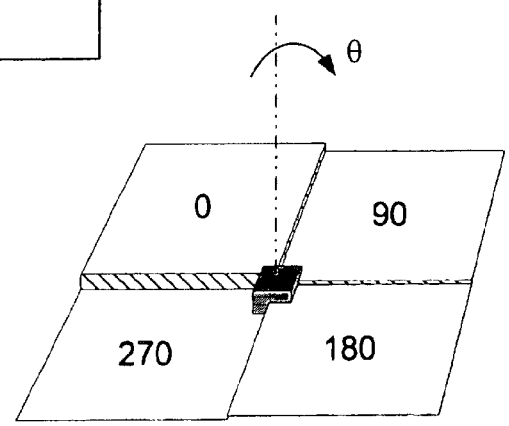

FIG. 8 shows the results of a calculation of the intensity profiles of the light produced by the mask of FIG. 6. The dark lines running horizontally and vertically are an artifact and should be ignored. Note that the minima 80 corresponding to the areas 60 of FIG. 6 are surrounded by annular areas 82 where the intensity is substantially greater than the intensity of the minima 80.

Figure 9:
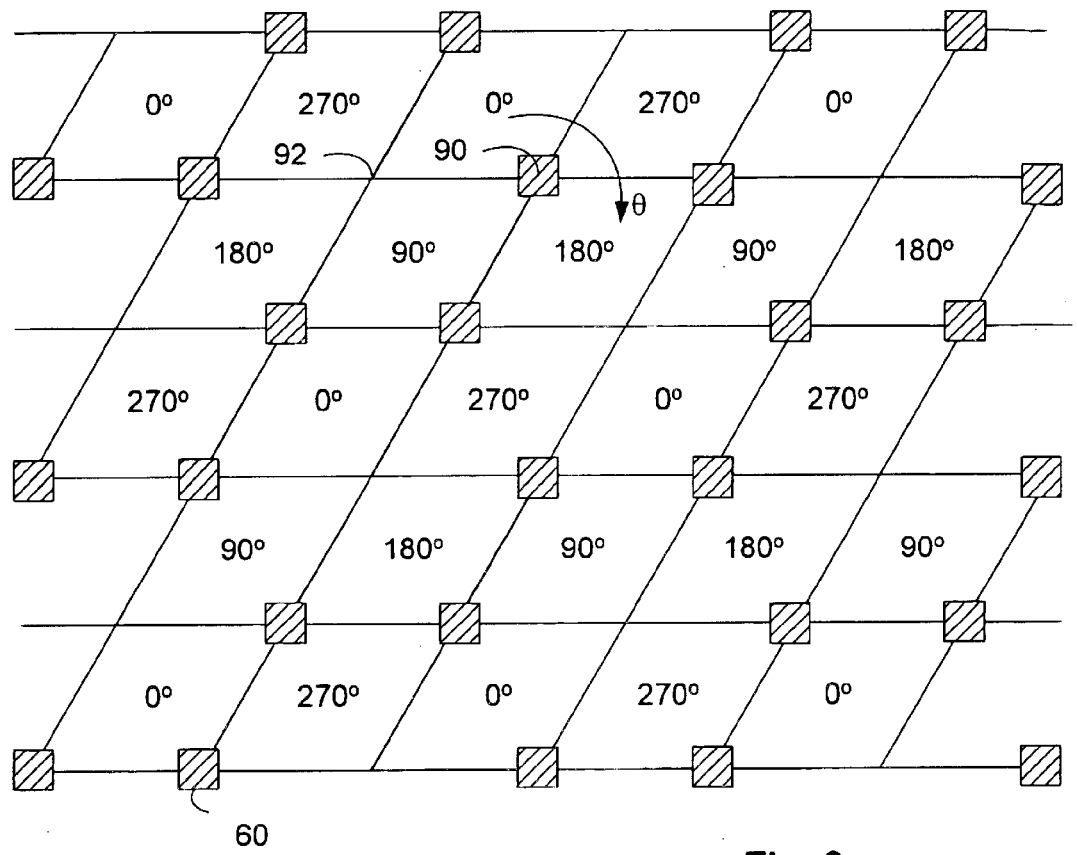
FIG. 9 shows an alternative embodiment pattern.

FIG. 9 shows an alternative embodiment pattern used to produce intensity minima on a hexagonal grid using 4 different phase shift levels. The opaque areas 90 show the hexagonal grid points of the phase shift mask substrate corresponding to intensity minima desired on the resist. The areas corresponding to intersection points 92 will also have intensity minima, and must be exposed using a second mask and a second exposure in order to produce the desired hexagonal pattern of unexposed resist.

Figure 10:
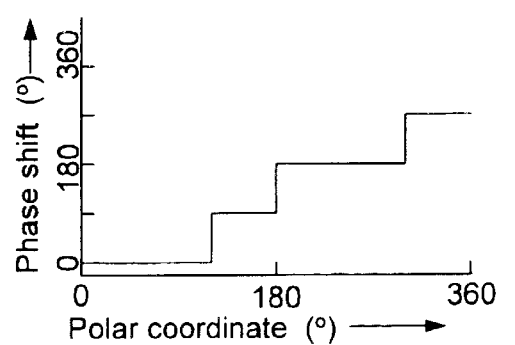
FIG. 10 shows the phase shift produced about an opaque area 90.

FIG. 10 shows the phase shift produced about an opaque area 90 as a function of the polar angle θ measured around the center of the opaque area 90 for the embodiment of FIG. 9.

Obviously, many modifications and variations of the present invention are possible in light of the above teachings. It is therefore to be understood that, within the scope of the appended claims, the invention may be practiced otherwise than as specifically described.

I claim:

1. An apparatus, comprising:
   a phase shift mask (PSM) substrate having a surface and a surface pattern, the surface for interacting with light of wavelength λ and intensity $I_0$ to change the phase of the light in a pattern determined by the surface pattern, wherein the intensity of the light after interacting with the surface is determined at least in part by the phase changes induced by the surface pattern, and wherein when the light passes through a lens of a lithographic system having a numerical aperture (N.A.) so that the surface is imaged on an image plane, the intensity of the light imaged on the image plane has a plurality of point images, each point image having an intensity minimum of intensity $I_{min}$ surrounded by an annular area having intensity much greater than $I_{min}$ throughout the entire annular area surrounding the intensity minimum, and wherein the full width of the intensity minimum is less than $\lambda/2$ N.A.

2. An apparatus, comprising;

a phase shift mask (PSM) substrate having a large plurality of phase shift areas, at least some of the large plurality of phase shift areas having at least one wedge shaped area boundary, wherein a feature is formed by n wedge shaped area boundaries of n of the large plurality of phase shift areas fitting together to surround a first point on the PSM substrate, the n phase shift areas cooperating together to produce a pattern of light intensity for light of wavelength $\lambda$ and intensity $I_0$ interacting with the n phase shift areas, wherein the pattern of light intensity has a deep minimum $I_{min}$ in light intensity corresponding to the point on the PSM, and wherein the intensity of the light after interacting with the surface has intensity much greater than $I_{min}$ in an annular area surrounding the first point, and wherein n is greater than or equal to four, and wherein each of the n phase shift areas has a different phase shift.

3. The apparatus of claim 2, where the large plurality of phase shift areas are flat areas with surfaces parallel to each other.

4. The apparatus of claim 3, where n=4 and the phase shift of the four phase shift areas are approximately 0°, 90°, 180°, and 270°, counting in order moving in one direction around the first point, wherein the 4 phase shift areas form a shape of a spiral staircase about the first point.

5. The apparatus of claim 4, where the wedge shaped area boundaries have wedge angles, and wherein the 0° and 180° phase shift areas have approximately equal wedge angles, and wherein the 90° and 270° phase shift areas have approximately equal wedge angles.

6. The apparatus of claim 4, wherein a second point is located near the first point, and wherein the spiral staircases about the first and the second point each have a different handedness, and wherein one step of each spiral staircase is the same phase shift area.

7. The apparatus of claim 6, wherein the PSM substrate is designed for use in a photolithography system having a magnification of M and a numerical aperture N.A., and wherein the first point and the second point are spaced a distance less that $2M\lambda/N.A.$ apart.

8. An apparatus, comprising:

a phase shift mask (PSM) substrate having a surface and a surface pattern, the surface for interacting with light of wavelength $\lambda$ and intensity $I_0$ to change the phase of the light in a pattern determined by the surface pattern, wherein the intensity of the light after interacting with the surface is determined at least in part by the phase changes induced by the surface pattern, and wherein a plurality of points on the surface have a surface pattern surrounding each point such that there exists a line nearly encircling each point such that phase changes along the line, and that the phase does not change in jumps greater than 120° along the line, and that the phase changes by at least 240° from one end of the line to the other.

9. The apparatus of claim 8, wherein a phase change from one end of the line to the other is approximately m times 360°, where m is an integer greater than or equal to one.

* * * * *